United States Patent
Priebe et al.

(10) Patent No.: US 8,924,835 B2
(45) Date of Patent: Dec. 30, 2014

(54) CONTENT ADDRESSABLE MEMORY CONTINUOUS ERROR DETECTION WITH INTERLEAVE PARITY

(71) Applicant: LSI Corporation, Milpitas, CA (US)

(72) Inventors: Gordon W. Priebe, Mendota Heights, MN (US); Carl W. Swanson, Mendota Heights, MN (US); David B. Grover, Mendota Heights, MN (US); Christopher D. Browning, Mendota Heights, MN (US)

(73) Assignee: LSI Corporation, Milpitas, CA (US)

( * ) Notice: Subject to any disclaimer, the term of this patent is extended or adjusted under 35 U.S.C. 154(b) by 161 days.

(21) Appl. No.: 13/628,616

(22) Filed: Sep. 27, 2012

(65) Prior Publication Data

US 2014/0089769 A1 Mar. 27, 2014

(51) Int. Cl.
*G11C 29/00* (2006.01)

(52) U.S. Cl.
USPC ........................ 714/805; 714/718; 365/49.17

(58) Field of Classification Search
USPC ................................ 714/718, 805; 365/49.17
See application file for complete search history.

(56) References Cited

U.S. PATENT DOCUMENTS

| | | | |
|---|---|---|---|
| 2004/0015753 A1* | 1/2004 | Patella et al. | 714/718 |
| 2011/0194325 A1* | 8/2011 | Ramaraju et al. | 365/49.17 |

* cited by examiner

*Primary Examiner* — Sam Rizk
(74) *Attorney, Agent, or Firm* — Sheridan Ross P.C.

(57) ABSTRACT

Aspects of the disclosure pertain to a system and method for promoting improved error detection efficiency in a Content-Addressable Memory (CAM). The system and method provide CAM continuous error detection with interleave parity. The system continuously monitors for changes in cell contents and, when (e.g., as soon as) a soft error occurs, the error detection output bit for that entry will change, causing an error flag at chip level. The system can then immediately stop compare operations and rewrite the failing entry. Separate read operations are not needed to check for errors, thereby decreasing overall dynamic power usage and increasing possible search frequency for the system.

13 Claims, 3 Drawing Sheets

CONTENT ADDRESSABLE MEMORY CONTINUOUS ERROR DETECTION WITH INTERLEAVE PARITY

BACKGROUND

Content-Addressable Memory (CAM) is a special type of computer memory used in certain very high speed searching applications. Current CAM implementations can suffer from several performance issues.

SUMMARY

This Summary is provided to introduce a selection of concepts in a simplified form that are further described below in the Detailed Description. This Summary is not intended to identify key and/or essential features of the claimed subject matter. Also, this Summary is not intended to limit the scope of the claimed subject matter in any manner Aspects of the disclosure pertain to a system and method for promoting improved error detection efficiency in a Content-Addressable Memory (CAM). The system and method provide CAM continuous error detection with interleave parity.

DETAILED DESCRIPTION

Aspects of the disclosure are described more fully hereinafter with reference to the accompanying drawings, which form a part hereof, and which show, by way of illustration, example features. The features can, however, be embodied in many different forms and should not be construed as limited to the combinations set forth herein; rather, these combinations are provided so that this disclosure will be thorough and complete, and will fully convey the scope. Among other things, the features of the disclosure can be facilitated by methods, devices, and/or embodied in articles of commerce. The following detailed description is, therefore, not to be taken in a limiting sense.

A Content-Addressable Memory (CAM) is a special type of computer memory used in certain very high speed searching applications. CAM can also be known as associative memory, associative storage or an associative array. CAM is often used in computer networking devices. CAMs can include binary CAMs, ternary CAMs (e.g., mask-data CAMs) and XY CAMs. For example, ternary CAMs are often used in network routers. Further implementations for CAMs can include semiconductor implementations. Other applications, implementations and/or uses for CAMs can include: CPU cache controllers; translation lookaside buffers; database engines; data compression hardware; artificial neural networks; and/or intrusion prevention systems.

In typical CAMs, decreases in device dimensions and power supply have reduced noise margins and have resulted in increased soft error rates for core cells (e.g., bit cells) of the CAMs. In typical CAMs, when a soft error occurs, data in a CAM entry would change and search outputs would be incorrect.

An existing approach to eliminate soft errors in a CAM is to periodically read the contents of each CAM entry and compare it to the original data. This approach is tedious because a separate read operation is needed for each entry. Every read operation takes time away from doing compare operations, which is a primary purpose of a CAM. Every read operation (e.g., read) uses extra power, which costs the user money.

Another existing approach to eliminate soft errors in a CAM is to use parity bits that are checked using a separate read cycle. When an entry is written, parity bits are created from the data written in and stored alongside the original data. Using a read cycle, the user can read the contents of the cells, recreate the parity bits and compare the newly created parity bits to the original parity bits. With this approach, the user needs a separate read operation for each entry. The error is only found when this check is done. The end result is that many compare operations may have passed giving incorrect search results.

As more fully set forth below, aspects of the disclosure include a system configured for promoting improved error detection efficiency in a CAM by providing CAM continuous error detection with interleave parity.

Figure 1:
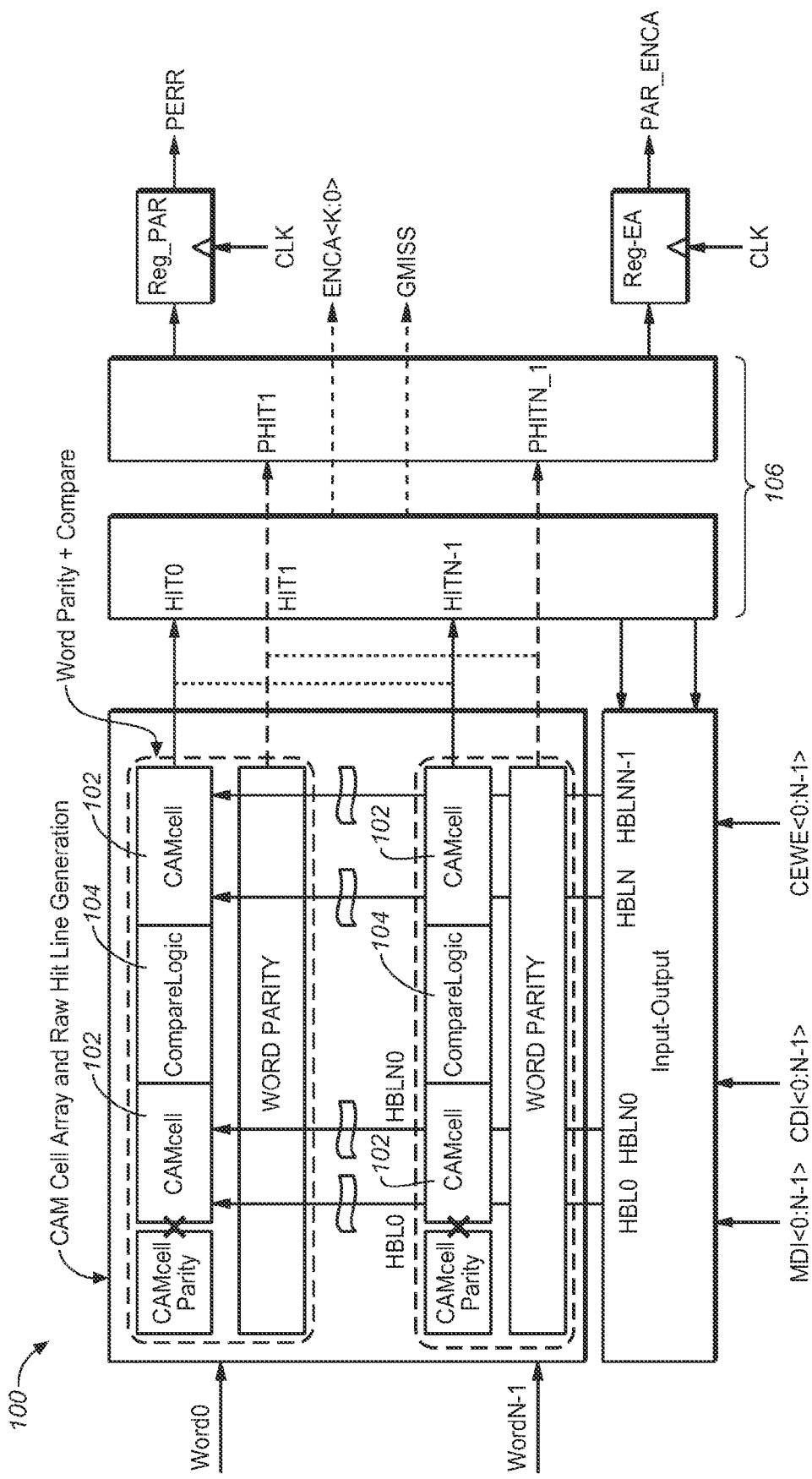
FIG. 1 is an example conceptual block diagram schematic of a continuous error detection system.
Figure 3:
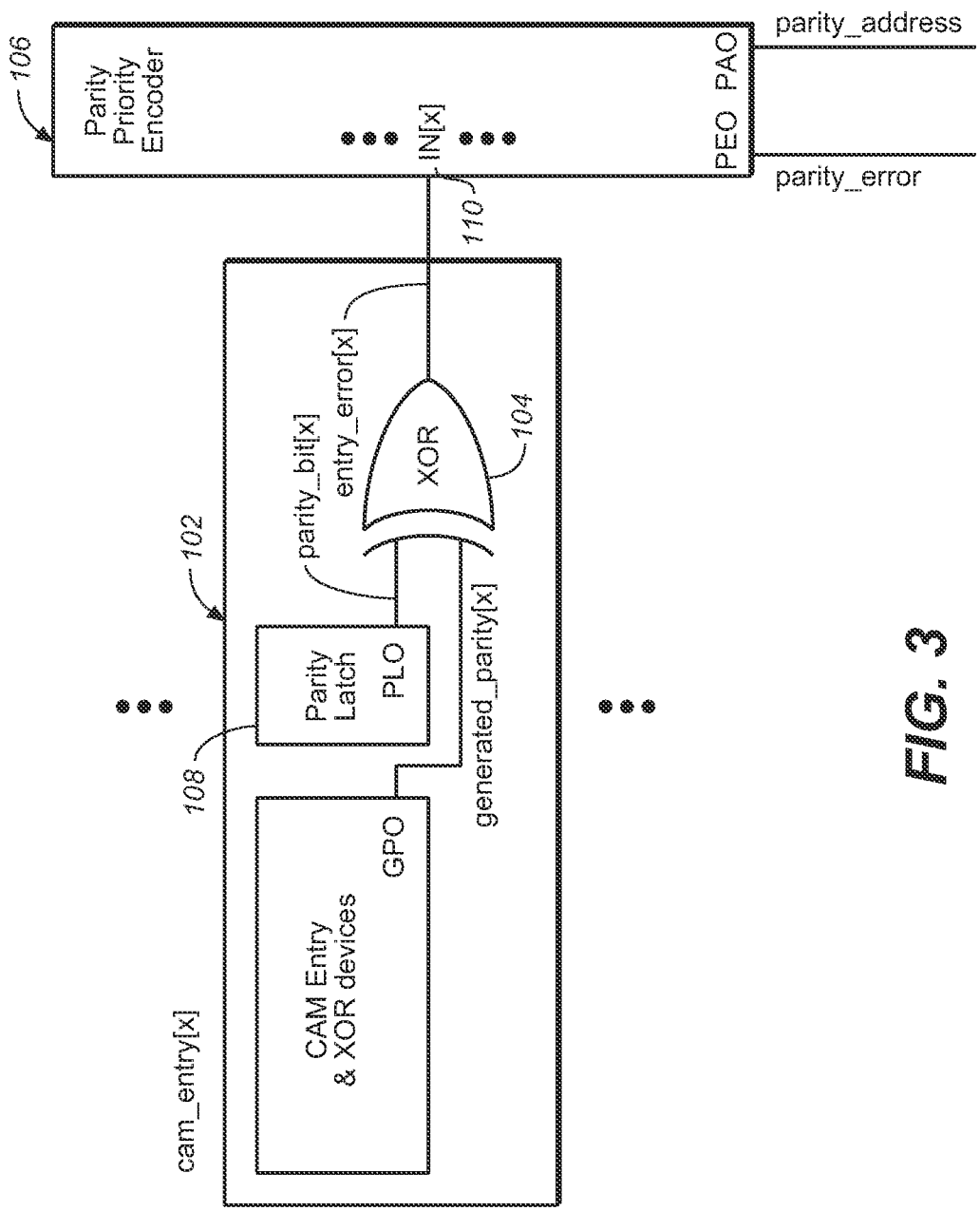
FIG. 3 is an example conceptual block diagram schematic of the continuous error detection system shown in FIG. 1.

As indicated in FIGS. 1 and 3 (FIG. 1 and FIG. 3), a conceptual block diagram schematic of a system 100 is shown. The system 100 can be a continuous error detection circuit. In embodiments, the system 100 can include a Content Addressable Memory (CAM). For example, the CAM can be a binary CAM, ternary CAM, an XY CAM or the like. The CAM can include a plurality of core cells 102 (e.g., CAM core cells, each shown as "CAMcell" in FIG. 1). For example, each CAM core cell 102 can include a memory cell (e.g., a standard 6-Transistor (6T) Static Random Access Memory (SRAM) cell) and additional devices, circuitry and/or logic (e.g., comparison logic, shown as "CompareLogic" in FIG. 1) 104 configured for performing comparison operations.

In embodiments, an internal data storage net of the memory cell (e.g., an internal data storage net of the 6T SRAM cell) can be configured for being brought out as a port (e.g., port NT). Each core cell 102 in an entry of the CAM can include an associated XOR2 logic gate as part of its comparison logic 104. A first input of the XOR2 logic gate can be connected to port NT. A second input of the XOR2 logic gate can be configured for being connected to an output of a neighboring XOR2 logic gate. In embodiments, a daisy chain configuration of XOR2 gates can be configured (e.g., always in a same direction) across an entire CAM entry until there is a single output at the end. In other embodiments, the XOR2 gates can be configured in a combinational (e.g., hierarchy) configuration. The system 100 is configured for causing an output (e.g., a final output, a generated parity output, generated parity) to switch (e.g., change) when any bit of the CAM entry changes. The generated parity output (GPO) of the CAM entry dynamically changes based upon the state of the cells (e.g., when a write operation changes a data state/cell data of the CAM entry, when a soft error (SER event) occurs and flips the cell(s))

In embodiments, when the system 100 writes a CAM entry, the parity bit can have a certain value. This parity bit value can be stored in a separate Soft Error Rate (SER) hardened latch (e.g., latch circuit) 108 corresponding to the written CAM entry. For example, for each CAM entry written by the system 100, a parity bit corresponding to that CAM entry can be stored in a SER hardened latch 108 corresponding to that CAM entry and is updated only upon occurrence of a write operation. In the system 100 disclosed herein, when a soft error happens, a state of a CAM core cell 102 can change, thereby causing a value of the generated parity output to change and not match the value of the parity bit (e.g., parity latch output (PLO)) stored in and output from the SER hardened latch 108. This can produce an entry error (e.g., a mismatch flag) on the corresponding CAM entry that can be fed into a priority encoder 106 (e.g., a parity priority encoder) or Read Only Memory (ROM) that can communicate to the system 100 an exact location which needs to be re-written.

When more than one CAM entry concurrently gets corrupted (e.g., experiences a soft error), the system 100 can be configured for fixing the soft errors sequentially until each of them is fixed and all mismatch (e.g., error) flags are reset. For example, in such multi-error instances, the system 100 can be configured such that: it would fix one error; it would then detect that another error is still present; it would then fix that error, and so forth. When all errors are corrected, the system 100 is configured for allowing compare operations to resume.

When a soft error flips two or more bits of a single CAM entry of the system 100, it is possible that a single parity bit would not change. Under such a scenario, the bits physically located next to each other would all get corrupted concurrently (e.g., at the same time). In embodiments, the system 100 can be configured to implement interleaved parity to minimize the chance of missing the error. For example, when implementing interleaved parity, every other CAM core cell 102 (e.g., two parity bits), or every four CAM core cells 102 (e.g., four parity bits), or even more CAM core cells 102 can be configured for being connected together in a chain of XOR2 gates (e.g., the same number of XOR2 gates would be implemented in each instance). For two parity bits, every other CAM core cell 102 of the system 100 can be connected through XOR2 gates, but two horizontal metal lines would be needed for providing such connection. For four parity bits, every four CAM core cells 102 of the system 100 can be connected through XOR2 gates, but four horizontal metal lines would be needed for providing such connection. In embodiments, a same parity bit compare can be used, whether comparing two or four bits. Using more parity bits would allow the system 100 to provide much more robust soft error detection, but could also make the circuit area larger because of the additional wires needed.

In embodiments, the system 100, as shown in FIG. 1, implements an entry with a single parity bit output. XOR2 gates (e.g., of the comparison logic) can be implemented by the system 100 in several ways, either via standard logic gates or with pass gate logic. The system 100 can also include the priority encoder 106. The priority encoder 106 can be configured for finding an address of a failing or failed CAM entry. The system 100 can be configured such that, the entry error (e.g., error flag, error flag output, entry error output) coming out of each CAM entry can be fed into the priority encoder 106 via one or more input ports (e.g., IN) 110 of the priority encoder (e.g., on input port for each CAM entry), so that the failed or failing address would provide another output. If there were multiple failing or failed CAM entries, the system 100 can be configured such that an instance level error flag would stay high after the first failing entry was re-written. A new address could then be output and would be corrected, and so forth until the instance level error flag was cleared.

The continuous error detection circuit system 100 described herein is configured for continuously identifying when a soft error occurs so that the system 100 can re-write a CAM entry corresponding to the soft error to correct the error. The system 100 can be configured for continuously monitoring for changes in contents of the CAM core cells 102 of the system 100. When an event happens, such as a particle collision that causes a CAM core cell 102 to change state, the generated parity output for that entry can change, causing an error flag at chip level. The system 100 described herein can be configured for immediately stopping comparison (e.g., compare) operations and for re-writing the failing entry.

The system 100 of the present disclosure provides numerous advantages over existing approaches for reducing and/or eliminating soft errors in a CAM. For example, existing approaches result in an inability to detect soft errors until a cell contents/parity bit read and comparison have been performed, thereby resulting in numerous incorrect search results being produced in the interim. The system 100 of the present disclosure can allow for a soft error to be detected the moment it occurs. Thus, the system 100 disclosed herein does not have to wait for a special checking operation to be performed, nor does it have to perform separate read operations to detect soft errors. This allows the system 100 of the present disclosure to promote a decrease in overall dynamic power usage by the system 100 and an increase in search frequency of the system 100. This also provides a user of the system 100 to have additional cycles for compare operations. Further, the system 100 disclosed herein can be configured for detecting (e.g., catching, identifying) post-test issues, such as latent defects, which may occur.

As mentioned above, using interleaved parity has the distinction of detecting errors when two or four cells 102 located physically next to each other all change polarity at once. If only one parity bit was to exist and an even number of cells flipped, then the parity bit would not change and the soft error would be undetected. The more parity bits used, the stronger error detection becomes.

Figure 2:
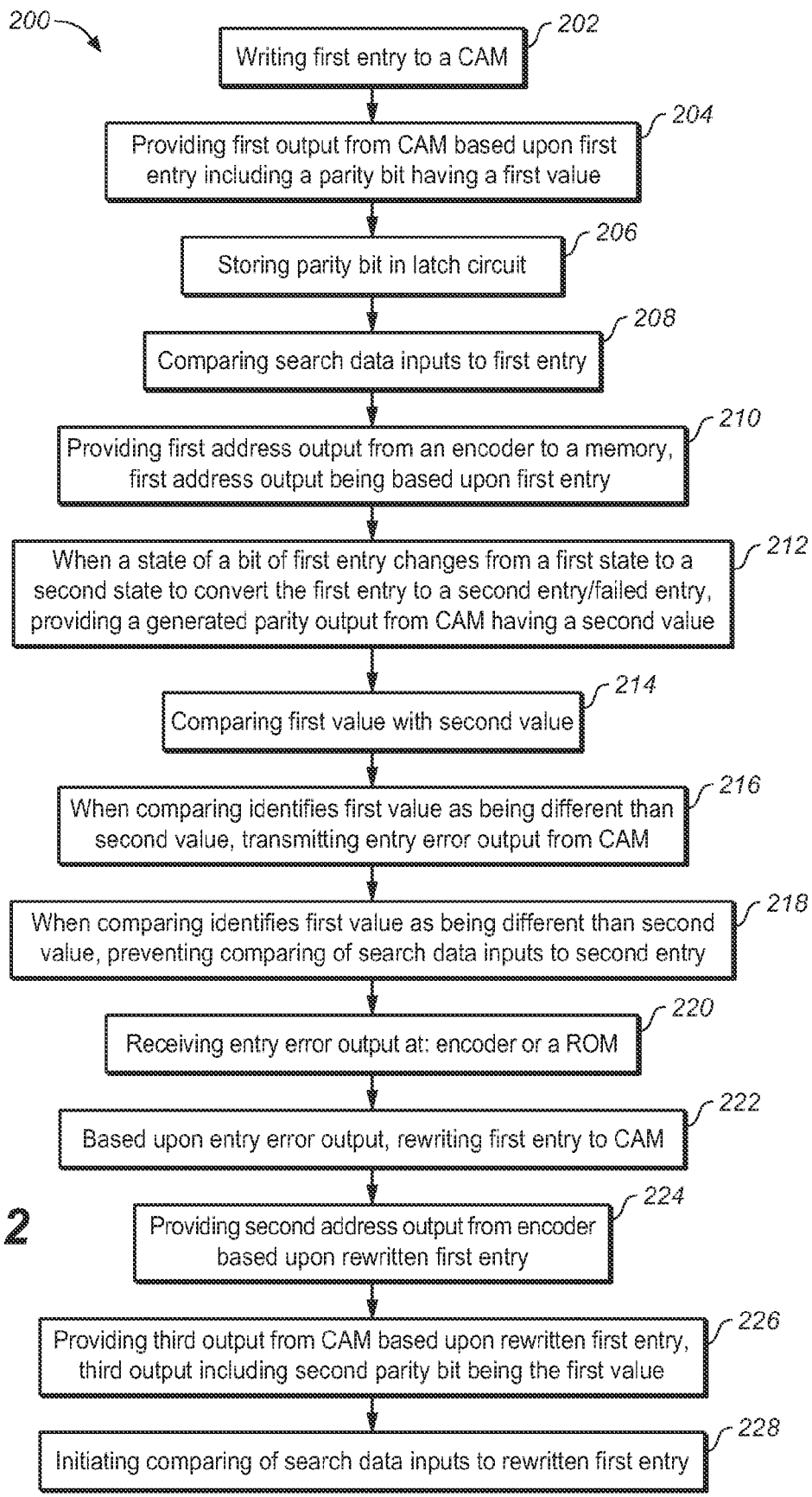
FIG. 2 is a flow chart illustrating a method for providing continuous error detection via a CAM system.

FIG. 2 is a flowchart illustrating a method for providing continuous error detection via a content addressable memory system, such as via system 100 described herein. The method 200 can include the step of writing a first entry to a content addressable memory of the system, the first entry including a plurality of bits, each bit included in the plurality of bits being in a first state 202. The method 200 can further include the step of providing a first output from the content addressable memory based upon the first entry, the first output being a parity bit, the parity bit being a first value 204.

The method 200 can further include the step of storing the parity bit in a latch circuit of the system 206. For example, the parity bit can be stored per entry in the parity latch 108. The method 200 can further include comparing search data inputs to the first entry of the content addressable memory (e.g., performing comparison operations) 208. The method 200 can further include the step of providing a first address output from an encoder of the system to a memory, the first address output being based upon the first entry 210. The method 200 can further include the step of, when a state of a bit included in the plurality of bits changes from the first state to a second state to convert the first entry to a second entry (e.g., when a soft error occurs), the second entry being a failed entry, providing a second output from the content addressable memory, the second output being a generated parity output, the generated parity output being a second value 212.

The method 200 can further include the step of comparing the first value with the second value 214. The method 200 can further include the step of, when comparing of the first value with the second value identifies the first value as being different than the second value, transmitting an error flag output from the content addressable memory 216. For example, when the first value and second value match, state is "0", when the first and second value mismatch, state is "1". The method 200 can further include the step of, when comparing of the first value with the second value identifies the first value as being different than the second value, preventing comparing of search data inputs to the second entry 218. The method 200 can further include the step of receiving the error flag output at: the encoder of the system or a Read Only Memory of the system 220.

The method 200 can further include the step of, based upon the received error flag output, rewriting the first entry to the content addressable memory 222. The method 200 can further include the step of providing a second address output from the encoder, the second address output being based upon the rewritten first entry 224. The method 200 can further include the step of providing a third output from the content addressable memory, the third output being based upon the rewritten first entry, the third output including a second parity bit, the second parity bit being the first value 226. The method 200 can further include the step of initiating comparing of search a inputs to the rewritten first entry 228.

The system 100 can be configured with one or more processing modules for providing processing functionality for the system 100 and may include any number of processors, micro-controllers, or other processing systems and resident or external memory for storing data and other information accessed or generated by a controller of the system 100. The processing module(s) may execute one or more software programs, which implement techniques described herein. The processing module(s) is/are not limited by the materials from which they are formed or the processing mechanisms employed therein, and as such, may be implemented via semiconductor(s) and/or transistors (e.g., using electronic integrated circuit (IC) components), and so forth.

It is to be noted that the foregoing described embodiments may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the embodiments described herein may be conveniently implemented in forms of a software package. Such a software package may be a computer program product which employs a non-transitory computer-readable storage medium including stored computer code which is used to program a computer to perform the disclosed functions and processes disclosed herein. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A system, comprising:
   a content addressable memory including a plurality of core cells, the plurality of core cells configured with memory cells for storing a plurality of bits of a first entry written to the content addressable memory, the plurality of bits of the first entry being in a first state, the plurality of core cells further including comparison logic for comparing the bits of the first entry to search data inputs provided to the content addressable memory, the content addressable memory configured for providing a first output based upon the first entry, the first output including a parity bit having a first value, the parity bit being stored in a latch circuit of the system; and
   an encoder connected to the content addressable memory, the encoder configured for providing a first address output based upon the first entry to a memory,
   wherein the content addressable memory is configured for providing a second output when a state of a bit included in the plurality of bits changes from the first state to a second state, thereby changing the first entry to a second entry, the second output being a generated parity output, the generated parity output having a second value, wherein the comparison logic is configured to continuously compare the first value with the second value, producing an entry error output from the content addressable memory when the first value is different than the second value, and preventing comparing of search data inputs to the second entry, wherein each core cell included in the plurality of core cells includes an XOR2 logic gate, the XOR2 logic gates of the plurality of core cells connected together in a daisy-chain configuration.

2. The system as claimed in claim 1, wherein the system, in response to the entry error output, is configured for rewriting the first entry to the content addressable memory.

3. The system as claimed in claim 1, wherein the memory cells are 6-transistor Static Random Access Memory cells.

4. The system as claimed in claim 1, wherein the latch circuit is a Soft Error Rate-hardened latch circuit.

5. A method for providing continuous error detection via a content addressable memory system, the method comprising:
   writing a first entry to a content addressable memory of the system, the first entry including a plurality of bits, each bit included in the plurality of bits being in a first state, the content addressable memory including a plurality of core cells;
   providing a first output from the content addressable memory based upon the first entry, the first output being a parity bit, the parity bit being a first value;
   storing the parity bit in a latch circuit of the system;
   comparing search data inputs to the first entry of the content addressable memory; and
   providing a first address output from an encoder of the system to a memory, the first address output being based upon the first entry;
   when a state of a bit included in the plurality of bits changes from the first state to a second state to convert the first entry to a second entry, the second entry being a failed entry, providing a second output from the content addressable memory, the second output being generated parity output, the generated parity output being a second value;
   continuously comparing, via comparison logic, the first value with the second value; and
   when comparing of the first value with the second value identifies the first value as being different than the second value, transmitting an entry error output from the content addressable memory,
   wherein each core cell included in the plurality of core cells includes an XOR2 logic gate that comprises the comparison logic, the XOR2 logic gates of the plurality of core cells connected together in a daisy-chain configuration.

6. The method as claimed in claim 5, further comprising:
   when comparing of the first value with the second value identifies the first value as being different than the second value, preventing comparing of search data inputs to the second entry.

7. The method as claimed in claim 6, further comprising: receiving the entry error output at: the encoder of the system or a Read Only Memory of the system.

8. The method as claimed in claim 7, further comprising: based upon the entry error output, rewriting the first entry to the content addressable memory.

9. The method as claimed in claim 8, further comprising: providing a second address output from the encoder, the second address output being based upon the rewritten first entry.

10. The method as claimed in claim 9, further comprising: providing a third output from the content addressable memory, the third output being based upon the rewritten first entry, the third output including a second parity bit, the second parity bit being the first value.

11. The method as claimed in claim 10, further comprising: initiating comparing of search data inputs to the rewritten first entry.

12. A non-transitory computer-readable medium having computer-executable instructions for performing a method for providing continuous error detection via a content addressable memory system, the method comprising:

writing a first entry to a content addressable memory of the system, the first entry including a plurality of bits, each bit included in the plurality of bits being in a first state, the content addressable memory including a plurality of core cells;

providing a first output from the content addressable memory based upon the first entry, the first output including a parity bit, the parity bit being a first value;

storing the parity bit in a latch circuit of the system;

comparing search data inputs to the first entry of the content addressable memory; and providing a first address output from an encoder of the system to a memory, the first address output being based upon the first entry;

when a state of a bit included in the plurality of bits changes from the first state to a second state to convert the first entry to a second entry, the second entry being a failed entry, providing a second output from the content addressable memory, the second output being a generated parity output, the generated parity output being a second value;

continuously comparing, via comparison logic, the first value with the second value; and when comparing of the first value with the second value identifies the first value as being different than the second value: transmitting an entry error output from the content addressable memory, and preventing comparing of search data inputs to the second entry, wherein each core cell included in the plurality of core cells includes an XOR2 logic gate that comprises the comparison logic, the XOR2 logic gates of the plurality of core cells connected together in a daisy-chain configuration.

13. The non-transitory computer-readable medium as claimed in claim 12, the method further comprising:

receiving the entry error output at: the encoder of the system or a Read Only Memory of the system;

based upon the entry error output, rewriting the first entry to the content addressable memory;

providing a second address output from the encoder, the second address output being based upon the rewritten first entry;

providing a third output from the content addressable memory, the third output being based upon the rewritten first entry, the third output including a second parity bit, the second parity bit being the first value; and initiating comparing of search data inputs to the rewritten first entry.

\* \* \* \* \*